United States Patent
Yoon

(10) Patent No.: US 7,019,599 B2
(45) Date of Patent: Mar. 28, 2006

(54) APPARATUS FOR CONTINUOUS PHASE QUADRATURE AMPLITUDE MODULATION AND DEMODULATION

(75) Inventor: Dong Weon Yoon, Daejon (KR)

(73) Assignee: Utstarcom Inc., (KR)

( * ) Notice: Subject to any disclaimer, the term of this patent is extended or adjusted under 35 U.S.C. 154(b) by 36 days.

(21) Appl. No.: 10/501,384

(22) PCT Filed: Jan. 14, 2003

(86) PCT No.: PCT/KR03/00072

§ 371 (c)(1),
(2), (4) Date: Jul. 13, 2004

(65) Prior Publication Data

US 2005/0068096 A1   Mar. 31, 2005

(51) Int. Cl.
*H03K 7/00* (2006.01)

(52) U.S. Cl. .............. 332/106; 332/103; 329/304; 329/308; 375/376; 375/324; 375/327; 375/261

(58) Field of Classification Search ........... 329/304, 329/308; 332/103, 106; 375/376, 324, 327, 375/261

See application file for complete search history.

(56) References Cited

U.S. PATENT DOCUMENTS

| | | | |
|---|---|---|---|
| 5,081,647 A | 1/1992 | Bremer | 376/216 |
| 5,151,925 A | 9/1992 | Gelin et al. | 375/328 |
| 5,381,450 A | 1/1995 | Lane | 375/340 |
| 5,444,415 A | 8/1995 | Dent et al. | 329/302 |
| 5,495,510 A | 2/1996 | Kimiavi | 375/371 |
| 5,523,726 A | 6/1996 | Kroeger et al. | 332/103 |
| 5,659,574 A | 8/1997 | Durrant et al. | 375/150 |

(Continued)

OTHER PUBLICATIONS

International Search Report, PCT/KR 03/00072, International filing date Jan. 14, 2003, Search Report mailed Apr. 30, 2003.

*Primary Examiner*—Arnold Kinkead
(74) *Attorney, Agent, or Firm*—Thelen Reid & Priest LLP

(57) ABSTRACT

An apparatus for continuous phase quadrature amplitude modulation and demodulation to continuously process phases and amplitudes at symbol change points in an M-ary quadrature amplitude modulation method. The apparatus includes a continuous phase quadrature modulator having a first multiplier multiplying an I-channel by a cosine wave weighted function, a second multiplier multiplying an output signal of the first multiplier by a cosine wave of a carrier frequency, a delay delaying a Q-channel by a predetermined time, a third multiplier multiplying the Q-channel by a sine wave weighted function, a fourth multiplier multiplying an output signal of the third multiplier by the sine wave of the carrier frequency, and an adder adding an output signal of the second multiplier and an output signal of the fourth multiplier; and a continuous phase quadrature demodulator having a fifth multiplier multiplying the I-channel by the cosine wave of the carrier frequency, a sixth multiplier multiplying a signal from the fifth multiplier by the cosine wave weighted function, a first integrator and sampler integrating a signal from the sixth multiplier for the symbol duration time, a seventh multiplier multiplying the Q-channel by the sine wave of the carrier frequency, an eighth multiplier multiplying a signal from the seventh multiplier by the sine wave weighted function, and a second integrator and sampler integrating a signal from the eighth multiplier by the symbol duration time.

19 Claims, 3 Drawing Sheets

U.S. PATENT DOCUMENTS

| | | | |
|---|---|---|---|
| 5,692,013 A | 11/1997 | Koslov et al. | 375/277 |
| 5,767,739 A | 6/1998 | Witte | 329/306 |
| 5,812,604 A | 9/1998 | Herbst et al. | 375/308 |
| 5,832,043 A | 11/1998 | Eory | 375/344 |
| 5,966,412 A | 10/1999 | Ramaswamy | 375/341 |
| 6,125,148 A | 9/2000 | Frodigh et al. | 375/261 |
| 6,249,179 B1 | 6/2001 | Maalej et al. | 329/304 |
| 6,862,324 B1 * | 3/2005 | Lui et al. | 375/326 |

* cited by examiner

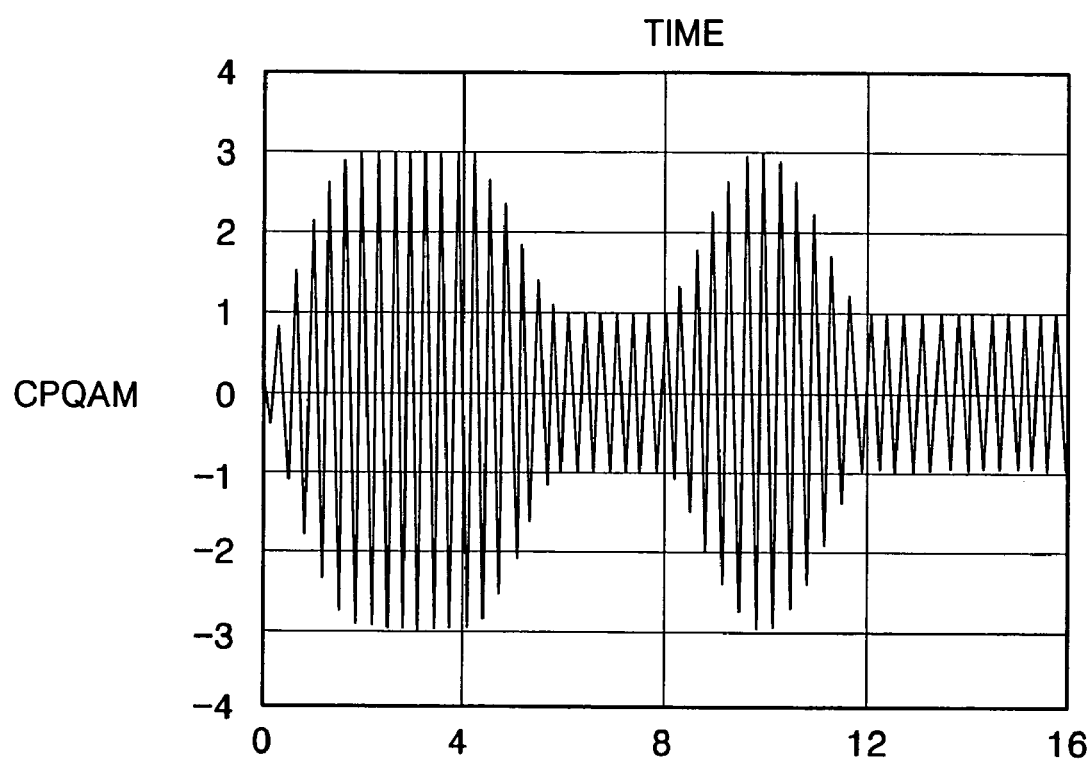

APPARATUS FOR CONTINUOUS PHASE QUADRATURE AMPLITUDE MODULATION AND DEMODULATION

CROSS-REFERENCE TO RELATED APPLICATION

This application claims priority based on International Patent Application No. PCT/KR03/00072, entitled "Apparatus for Continuous Phase Quardature Amplitude Modulation and Demodulation" by Dong Weon Yoon, which claims priority of Korean Application No. 2002-2018, filed on Jan. 14, 2002.

BACKGROUND OF THE INVENTION

1. Field of the Invention

The present invention relates to an apparatus for continuous phase quadrature amplitude modulation and demodulation, and more particularly, to an apparatus for continuous phase quadrature amplitude modulation and demodulation to continuously process phases and amplitudes at symbol change points in an M-ary quadrature amplitude modulation method.

2. Description of the Related Art

In general, phases are discontinuous at symbol change points in a quadature amplitude modulation method and a quadrature amplitude demodulation method. Accordingly, since a side-lobe does not drop rapidly, an adjacent channel interference occurs. In addition, since the amplitudes are discontinuous at symbol change points, a power amplifier has to quickly follow the amplitude.

SUMMARY OF THE INVENTION

To solve the above-described problems, it is an objective of the present invention to provide an apparatus for continuous phase quadrature amplitude modulation and demodulation to improve a spectrum efficiency by making the phases continuous at symbol change points of a quadrature amplitude modulation signal.

To solve the above-described problems, it is another objective of the present invention to provide an apparatus for continuous phase quadrature amplitude modulation and demodulation to reduce an adjacent channel interference by improving the roll-off speed of a side-lobe.

To solve the above-described problems, it is still another objective of the present invention to provide an apparatus for continuous phase quadrature amplitude modulation and demodulation to reduce loads of a power amplifier by making the changes continuous in amplitude at symbol change points.

To meet the above objective, according to one aspect of the present invention, there is provided an apparatus for continuous phase quadrature amplitude modulation and demodulation comprising a continuous phase quadrature modulator having a first multiplier multiplying an I-channel by a cosine wave weighted function, a second multiplier multiplying an output signal of the first multiplier by a cosine wave of a carrier frequency, a delay delaying a Q-channel by a predetermined time, a third multiplier multiplying the Q-channel by a sine wave weighted function, a fourth multiplier multiplying an output signal of the third multiplier by the sine wave of the carrier frequency, and an adder adding an output signal of the second multiplier and an output signal of the fourth multiplier; and a continuous phase quadrature demodulator having a fifth multiplier multiplying the I-channel by the cosine wave of the carrier frequency, a sixth multiplier multiplying a signal from the fifth multiplier by the cosine wave weighted function, a first integrator and sampler integrating a signal from the sixth multiplier for the symbol duration time, a seventh multiplier multiplying the Q-channel by the sine wave of the carrier frequency, an eighth multiplier multiplying a signal from the seventh multiplier by the sine wave weighted function, and a second integrator and sampler integrating a signal from the eighth multiplier by the symbol duration time.

It is preferable that the apparatus further comprises a signal mapper that separates a received binary data to the I-channel and the Q-channel and outputs the I-channel and the Q-channel to the first multiplier and the delay, respectively.

It is preferable that the apparatus further comprises a first oscillator that outputs the cosine wave weighted function.

It is preferable that the apparatus further comprises a first phase shifter that phase-shifts the cosine wave weighted function output from the first oscillator by 90 degrees and outputs the sine wave weighted function.

It is preferable that the cosine wave weighted function is $\cos w_i t$.

It is preferable that the cosine wave of the carrier frequency is $\cos w_c t$.

It is preferable that the predetermined time is the half of a symbol duration time.

It is preferable that the apparatus further comprises a second oscillator that outputs the cosine wave of the carrier frequency.

It is preferable that the apparatus further comprises a second phase shifter that phase-shifts the cosine wave of the carrier frequency output from the second oscillator by 90 degrees and outputs the sine wave of the carrier frequency.

It is preferable that the sine wave weighted function is $\sin w_i t$.

It is preferable that the sine wave of the carrier frequency is $\sin w_c t$.

It is preferable that the apparatus further comprises a phase locked loop (PLL) that controls the phase of a received signal.

It is preferable that the apparatus further comprises a clock generator that receives a signal from the PLL and generates a clock cycle having a predetermined amount of time.

It is preferable that the apparatus further comprises a third phase shifter that phase-shifts the cosine wave of the carrier frequency transferred from the PLL by 90 degrees and generates the sine wave of the carrier frequency.

It is preferable that the apparatus further comprises a second oscillator that receives the clock cycle from the clock generator and outputs the cosine wave weighted function.

It is preferable that the apparatus further comprises a fourth phase shifter that phase-shifts the cosine wave weighted function from the second oscillator by 90 degrees and outputs the sine wave weighted function.

It is preferable that the apparatus further comprises a first determiner that determines an integral signal from the first integrator and sampler.

It is preferable that the apparatus further comprises a second determiner that determines an integral signal from the second integrator and sampler.

It is preferable that the apparatus further comprises a signal demapper that receives signals from the first determiner and the second determiner and outputs a binary data.

BRIEF DESCRIPTION OF THE DRAWINGS

The above and other features and advantages of the present invention will become more apparent by describing in detail exemplary embodiments thereof with reference to the attached drawings in which:

FIG. 3 illustrates a waveform of an output signal from the continuous phase quadrature amplitude modulator of FIG. 1.

DETAILED DESCRIPTION OF THE INVENTION

The present invention will now be described in more detail with reference to the accompanying drawing.

Figure 1:
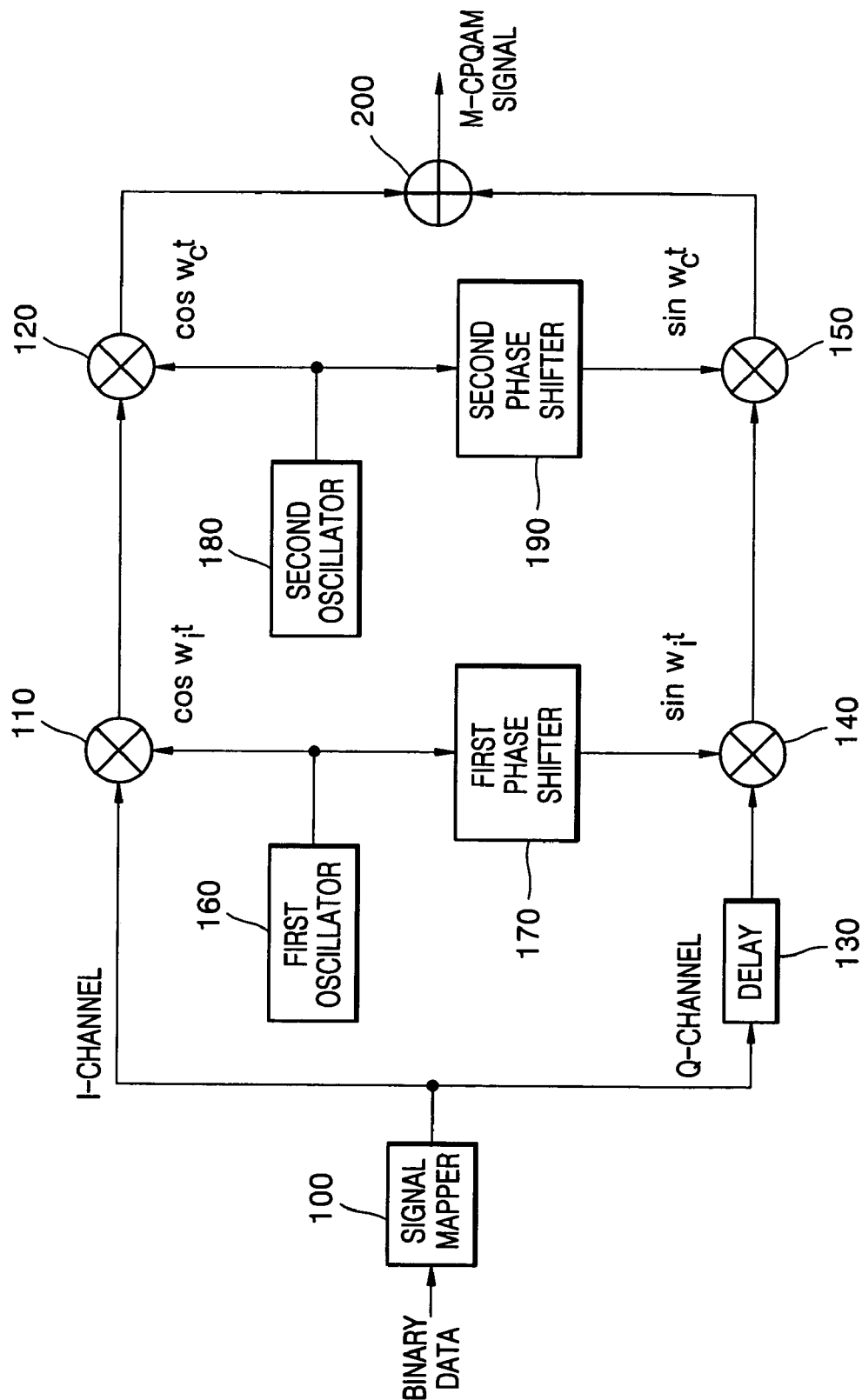
FIG. 1 is a block diagram illustrating a continuous phase quadrature amplitude modulator according to the present invention.
Figure 2:
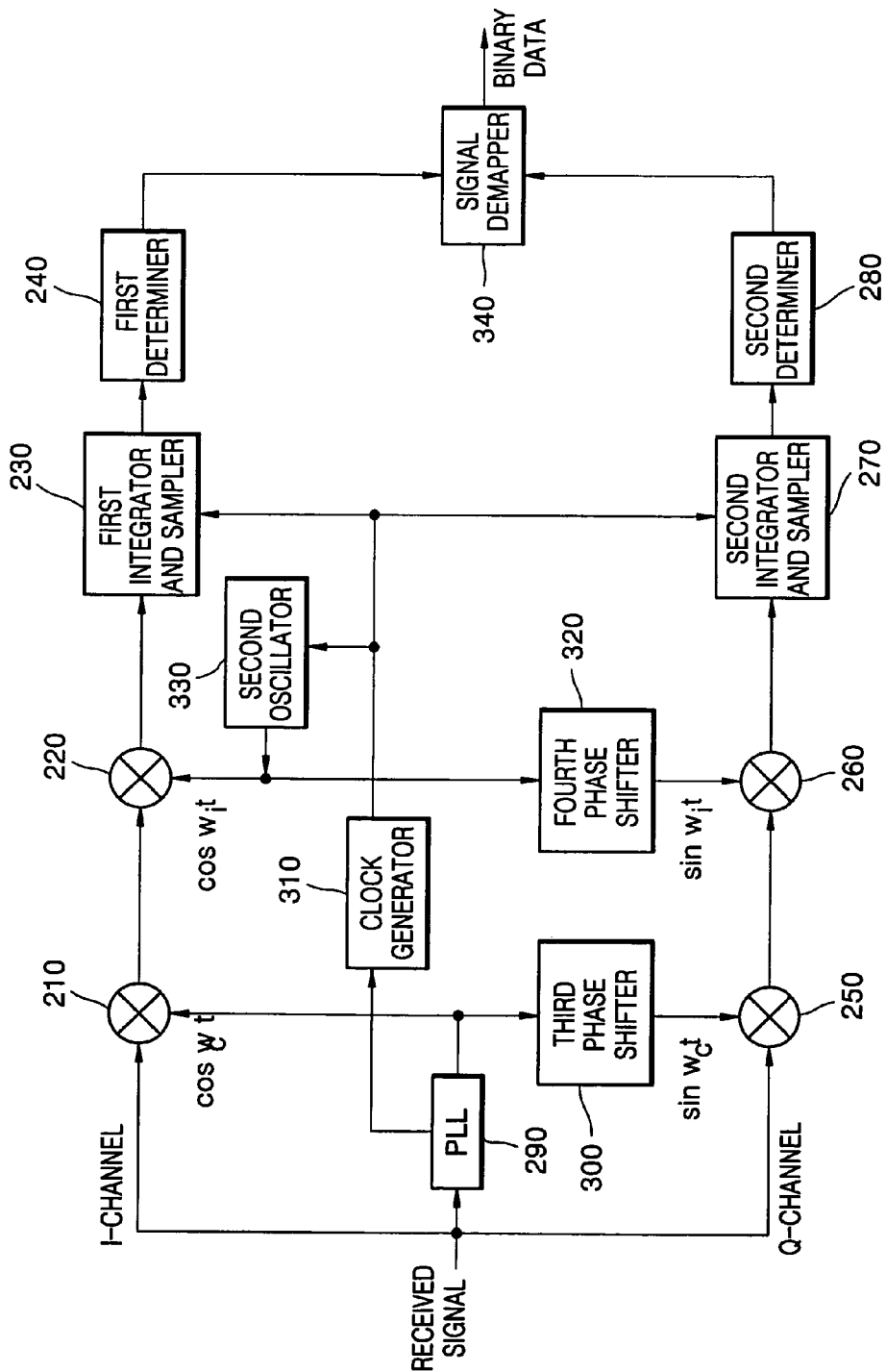
FIG. 2 is a block diagram illustrating a continuous phase quadrature amplitude demodulator according to the present invention.

FIG. 1 is a block diagram illustrating a continuous phase quadrature amplitude modulator according to the present invention, and FIG. 2 is a block diagram illustrating a continuous phase quadrature amplitude demodulator according to the present invention.

Referring to FIGS. 1 and 2, a continuous phase quadrature amplitude modulator according to the present invention includes a signal mapper 100, a first multiplier 110, a second multiplier 120, a delay 130, a third multiplier 140, a fourth multiplier 150, a first oscillator 160, a first phase shifter 170, a second oscillator 180, a second phase shifter 190, and an adder 200. A continuous phase quadrature amplitude demodulator includes a fifth multiplier 210, a sixth multiplier 220, a first integrator and sampler 230, a first determiner 240, a seventh multiplier 250, an eighth multiplier 260, a second integrator and sampler 270, a second determiner 280, a phase locked loop (PLL) 290, a third phase shifter 300, a clock generator 310, a fourth phase shifter 320, a second oscillator 330, and a signal demapper 340.

The first multiplier 110 multiplies an I-channel by a cosine wave weighted function, and the second multiplier 120 multiplies an output signal of the first multiplier 110 by a cosine wave of a carrier frequency. The delay 130 delays a Q-channel by half of the duration of a symbol duration time, and the third multiplier 140 multiplies the Q-channel by a sine wave weighted function. The fourth multiplier 150 multiplies an output signal of the third multiplier 140 by the sine wave of the carrier frequency, and the adder 200 adds an output signal of the second multiplier 120 and an output signal of the fourth multiplier 150. Here, the signal mapper 100 separates a received binary data to the I-channel and the Q-channel and outputs the I-channel and the Q-channel to the first multiplier 110 and the delay 130, respectively. The first oscillator 160 outputs the cosine wave weighted function. The first phase shifter 170 phase-shifts the cosine wave weighted function output from the first oscillator 160 by 90 degrees to output the sine wave weighted function. The second oscillator 180 outputs the cosine wave of the carrier frequency, and the second phase shifter 190 phase-shifts the cosine wave of the carrier frequency output from the second oscillator 180 by 90 degrees to output the sine wave of the carrier frequency.

The cosine wave weighted function is $\cos w_i t$, and the cosine wave of the carrier frequency is $\cos w_c t$. The sine wave weighted function is $\sin w_i t$, and the sine wave of the carrier frequency is $\sin w_c t$.

In addition, the fifth multiplier 210 multiplies the I-channel by the cosine wave of the carrier frequency, and the sixth multiplier 220 multiplies a signal from the fifth multiplier 210 by the cosine wave weighted function. The first integrator and sampler 230 integrates a signal from the sixth multiplier 220 for the symbol duration time. The seventh multiplier 250 multiples the Q-channel by the sine wave of the carrier frequency, and the eighth multiplier 260 multiplies a signal from the seventh multiplier 250 by the sine wave weighted function. The second integrator and sampler 270 integrates a signal from the eighth multiplier 260 for the symbol duration time. PLL 290 controls the phase of a received signal, and the clock generator 310 receives a signal from the PLL 290 to generate a clock cycle for a predetermined time. In addition, the third phase shifter 300 phase-shifts the cosine wave of the carrier frequency transferred from the PLL 290 by 90 degrees to generate the sine wave of the carrier frequency, and the second oscillator 330 receives the clock cycle from the clock generator 310 to output the cosine wave weighted function. The fourth phase shifter 320 phase-shifts the cosine wave weighted function from the second oscillator 330 by 90 degrees to output the sine wave weighted function. The first determiner 240 determines an integral signal from the first integrator and sampler 230, and the second determiner 280 determines an integral signal from the second integrator and sampler 270. The signal demapper 340 receives signals from the first determiner 240 and the second determiner 280 to output a binary data.

More specifically, the continuous phase quadrature amplitude modulator of FIG. 1 maps a $\log_2 M$ bit series signal, resulting from an M-ary quarature amplitude modulation, from a mapping table to corresponding quadrature amplitude modulation signal. The $\log_2 M$ bit series signal is divided into $\log_2 \sqrt{M}$ bits and assigned to the I-channel and the Q-channel. The I-channel signal is pulse shaped into the cosine wave weighted function of $\cos(\Pi/T_s)t$ and modulated into the cosine wave $\cos w_c t$ of the carrier frequency $f_c$. Here, $T_s$ is the symbol duration time.

On the other hand, the Q-channel signal has a time offset of $T_s/2$ from the I-channel due to the delay 130 that delays a signal by the half of the symbol duration time. The delayed signal is pulse shaped into the sine wave weighted function of $\sin(\Pi/T_s)t$ and modulated into the sine wave $\sin w_c t$ of the carrier frequency $f_c$. The modulated I-channel signal and the modulated Q-channel signal are added in the adder 200 and transferred through a channel. As a result, an output M-CPQAM signal continues phases and amplitudes at symbol change points to improve a frequency spectrum efficiency while reducing loads of a power amplifier (not shown).

When the continuous phase quadrature amplitude demodulator of FIG. 2 is used, the cosine signal and the sine signal transferred through the channel can be restored using the I-channel and the Q-channel because the cosine signal and the sine signal are orthogonal. First, the I-channel is multiplied by the cosine wave $\cos w_c t$ of the carrier frequency in the fifth multiplier 210 and multiplied by the sine wave weighted function of $\cos(\Pi/T_s)t$ in the sixth multiplier 220. The first integrator and sampler 230 integrates the multiplied signal and samples the integral signal to restore the signal into a base band signal corresponding to the Q-channel. Thereafter, a corresponding symbol is determined using the first determiner 240. The restored I-channel and Q-channel signals are determined into original signals using the mapping table.

FIG. 3 illustrates a waveform of an output signal from the continuous phase quadrature amplitude modulator of FIG. 1. Here, the waveform of FIG. 3 is obtained by simulating a 16-quadrature amplitude modulation signal. Referring to FIG. 3, when (3,−3), (1,−1), (3,1), and (1,−1) symbols are assigned as a 16-continuous phase quadrature amplitude modulation signal, the phases and the amplitudes are continuous at the multiple times of four, which are symbol change points. In addition, the present invention is not limited to an M-ary square quadarature amplitude modulation; however, the present invention can be applied to an optional rectangular quadrature amplitude modulation. Furthermore, the present invention can be applied to a hierarchical quadrature amplitude modulation that is proposed in digital broadcasting and other systems using I-Q modulation.

While this invention has been particularly shown and described with reference to preferred embodiments thereof, it will be understood by those skilled in the art that various changes in form and details may be made therein without departing from the spirit and scope of the invention as defined by the appended claims.

As described above, an apparatus for continuous phase quadrature amplitude modulation and demodulation according to the present invention has advantages as follows.

The apparatus for continuous phase quadrature amplitude modulation and demodulation improves a spectrum efficiency by making the phases and amplitudes continuous at symbol change points of a quadrature amplitude modulation signal, reduces an adjacent channel interference by improving the roll-off speed of a side-lobe, and reduces loads of a power amplifier.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for continuous phase quadrature amplitude modulation and demodulation, the apparatus comprising:
 a continuous phase quadrature modulator having a first multiplier multiplying an I-channel by a cosine wave weighted function, a second multiplier multiplying an output signal of the first multiplier by a cosine wave of a carrier frequency, a delay delaying a Q-channel by a predetermined time, a third multiplier multiplying the Q-channel by a sine wave weighted function, a fourth multiplier multiplying an output signal of the third multiplier by the sine wave of the carrier frequency, and an adder adding an output signal of the second multiplier and an output signal of the fourth multiplier; and
 a continuous phase quadrature demodulator having a fifth multiplier multiplying the I-channel by the cosine wave of the carrier frequency, a sixth multiplier multiplying a signal from the fifth multiplier by the cosine wave weighted function, a first integrator and sampler integrating a signal from the sixth multiplier for a symbol duration time, a seventh multiplier multiplying the Q-channel by the sine wave of the carrier frequency, an eighth multiplier multiplying a signal from the seventh multiplier by the sine wave weighted function, and a second integrator and sampler integrating a signal from the eighth multiplier by the symbol duration time.

2. The apparatus of claim 1, further comprising a signal mapper that separates a received binary data to the I-channel and the Q-channel and outputs the I-channel and the Q-channel to the first multiplier and the delay, respectively.

3. The apparatus of claim 1, further comprising a first oscillator that outputs the cosine wave weighted function.

4. The apparatus of claim 3, further comprising a first phase shifter that phase-shifts the cosine wave weighted function output from the first oscillator by 90 degrees and outputs the sine wave weighted function.

5. The apparatus of claim 1, wherein the cosine wave weighted function is $\cos w_i t$.

6. The apparatus of claim 1, wherein the cosine wave of the carrier frequency is $\cos w_c t$.

7. The apparatus of claim 1, wherein the predetermined time is the half of the symbol duration time.

8. The apparatus of claim 1, further comprising a second oscillator that outputs the cosine wave of the carrier frequency.

9. The apparatus of claim 8, further comprising a second phase shifter that phase-shifts the cosine wave of the carrier frequency output from the second oscillator by 90 degrees and outputs the sine wave of the carrier frequency.

10. The apparatus of claim 1, wherein the sine wave weighted function is $\sin w_i t$.

11. The apparatus of claim 1, wherein the sine wave of the carrier frequency is $\sin w_c t$.

12. The apparatus of claim 1, further comprising a phase locked loop (PLL) that controls the phase of a received signal.

13. The apparatus of claim 12, further comprising a clock generator that receives a signal from the PLL and generates a clock cycle having a predetermined amount of time.

14. The apparatus of claim 12, further comprising a third phase shifter that phase-shifts the cosine wave of the carrier frequency transferred from the PLL by 90 degrees and generates the sine wave of the carrier frequency.

15. The apparatus of claim 13, further comprising a second oscillator that receives the clock cycle from the clock generator and outputs the cosine wave weighted function.

16. The apparatus of claim 15, further comprising a fourth phase shifter that phase-shifts the cosine wave weighted function from the second oscillator by 90 degrees and outputs the sine wave weighted function.

17. The apparatus of claim 1, further comprising a first determiner that determines an integral signal from the first integrator and sampler.

18. The apparatus of claim 1, further comprising a second determiner that determines an integral signal from the second integrator and sampler.

19. The apparatus of claim 17, further comprising a signal demapper that receives signals from the first determiner and the second determiner and outputs a binary data.

* * * * *